(12) United States Patent
Liu et al.

(10) Patent No.: US 12,156,356 B2
(45) Date of Patent: Nov. 26, 2024

(54) ELECTRONIC ENCAPSULATION THROUGH STENCIL PRINTING

(71) Applicant: Flex Ltd., Singapore (SG)

(72) Inventors: Weifeng Liu, Dublin, CA (US); Jesus A. Tan, Fremont, CA (US); William L. Uy, San Jose, CA (US); Dongkai Shangguan, San Jose, CA (US)

(73) Assignee: Flex Ltd., Singapore (SG)

( * ) Notice: Subject to any disclaimer, the term of this patent is extended or adjusted under 35 U.S.C. 154(b) by 248 days.

(21) Appl. No.: 17/228,893

(22) Filed: Apr. 13, 2021

(65) Prior Publication Data

US 2021/0321524 A1 Oct. 14, 2021

Related U.S. Application Data

(60) Provisional application No. 63/009,073, filed on Apr. 13, 2020.

(51) Int. Cl.
| | |
|---|---|
| *H05K 5/06* | (2006.01) |
| *B29C 33/38* | (2006.01) |
| *B29C 33/40* | (2006.01) |
| *B29C 43/18* | (2006.01) |
| *B29C 43/36* | (2006.01) |
| *B29C 43/50* | (2006.01) |
| *B29C 45/14* | (2006.01) |
| *B29C 45/50* | (2006.01) |
| *B41F 15/08* | (2006.01) |

(52) U.S. Cl.
CPC ............. *H05K 5/065* (2013.01); *B29C 33/38* (2013.01); *B29C 33/405* (2013.01); *B29C 43/18* (2013.01); *B29C 43/36* (2013.01); *B29C 43/50* (2013.01); *B29C 45/14819* (2013.01); *B29C 45/50* (2013.01); *B41F 15/08* (2013.01); *B29C 2043/182* (2013.01); *B29C 2045/14852* (2013.01)

(58) Field of Classification Search
CPC ........ H05K 5/065; B29C 33/40; B29C 33/405
See application file for complete search history.

(56) References Cited

U.S. PATENT DOCUMENTS

| | | | | |
|---|---|---|---|---|
| 2006/0272150 | A1* | 12/2006 | Eguchi | H05K 5/0082 29/841 |
| 2010/0208920 | A1* | 8/2010 | Lee | H05K 5/065 361/752 |
| 2017/0295679 | A1* | 10/2017 | Kim | H05K 9/0088 |
| 2018/0255658 | A1* | 9/2018 | Kaneko | H05K 5/0082 |
| 2020/0135598 | A1* | 4/2020 | Watanuki | H05K 1/189 |
| 2021/0053258 | A1* | 2/2021 | Oi | C08K 7/18 |

FOREIGN PATENT DOCUMENTS

DE 102018215768 A1 * 3/2020

OTHER PUBLICATIONS

Machine translation of DE-102018215768-A1 (Year: 2020).*

* cited by examiner

*Primary Examiner* — Kyle A Cook
(74) *Attorney, Agent, or Firm* — Sheridan Ross P.C.

(57) ABSTRACT

Methods, devices, and systems are provided for the encapsulation of electronic devices. The encapsulation includes positioning an electronic device in a cavity of a mold, and screen or stencil printing an encapsulant, in a liquid form, around the flexible electronic device. The mold is of a sufficient thickness to allow the encapsulant to completely cover electronic components mounted on a first surface of the electronic device.

5 Claims, 11 Drawing Sheets

ELECTRONIC ENCAPSULATION THROUGH STENCIL PRINTING

CROSS REFERENCE TO RELATED APPLICATIONS

The present application claims the benefit of and priority, under 35 U.S.C. § 119, to U.S. Provisional Application Ser. No. 63/009,073, filed on Apr. 13, 2020, entitled "ELECTRONIC ENCAPSULATION THROUGH STENCIL PRINTING," the entire disclosure of which is hereby incorporated herein by reference, in its entirety, for all that it teaches and for all purposes.

FIELD

The present disclosure is generally directed to electronic devices, in particular, toward the encapsulation of electronic devices with a protective material.

BACKGROUND

The conventional encapsulation of electronics generally includes arranging an electronic device, or module, inside a mold cavity and then molding (e.g., via injection molding, compression molding, etc.) an encapsulation material around the electronic device. Once cured, the encapsulation material, or encapsulant, protects the electronic device from mechanical shock, moisture, debris, or other environmental exposure and/or damage.

Known methods of encapsulation of electronic devices include stencil printing and screen printing. Typically stencil or screen printing is used to print dielectric ink on conductive ink for protection. Dielectric ink is solvent-based and has low viscosity. As such, it can conventionally only be printed in thin layers, typically less than 100 microns after curing. Thus, this process cannot be used to encapsulate electronic components mounted on a printed circuit board that have high profiles (e.g., 100 microns to several millimeters).

One approach to overcome the limitation of dielectric printing is the use of removable dams or molds during the manufacturing process. A dam allows a thicker dielectric layer by controlling the outflow of dielectric and maintaining the dielectric within a defined area at a greater thickness. However, such dams have several disadvantages. For example, the addition and removal of the dam add extra steps to the manufacturing process, and may leave a rough edge on the dielectric layer or printed circuit board once the dam is removed. Typical materials to be used as dams or molds, like steel or aluminum, are rigid, and cannot be used in the final products for flexible electronics due to their rigidity.

Solvent dielectric ink can only be used to print thin layers of encapsulant (typically less than 100 microns), and thus cannot be used to cover electronics assemblies with high-profile components (e.g., in the range of several millimeters).

Accordingly, it is an object of the present disclosure to provide a method of encapsulating an electronic device that includes an encapsulant of sufficient thickness to cover mounted electronic components.

DESCRIPTION

Figure 1A:
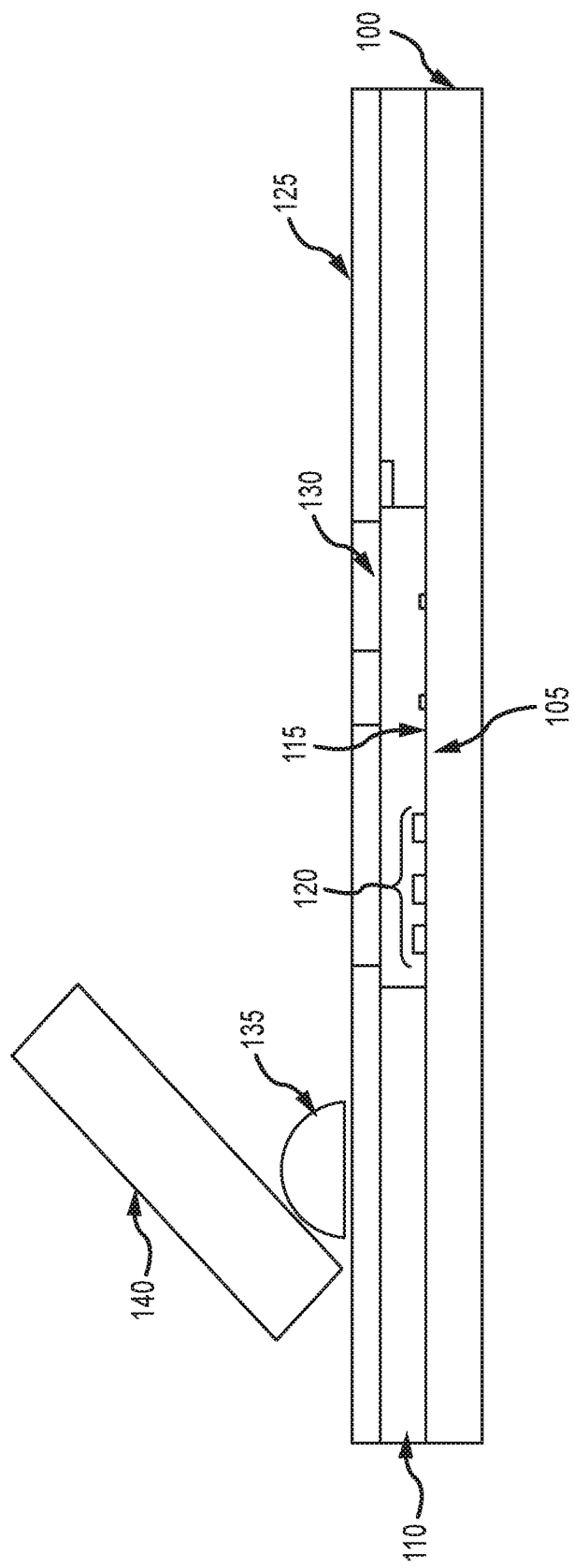
FIG. 1A shows a perspective view of an arrangement for encapsulating an electronic device in accordance with embodiments of the present disclosure.

It is with respect to the above issues and other problems that the embodiments presented herein were contemplated. It is an object the present disclosure to provide a reliable, safe, and low-cost method of encapsulation for electronic devices. Examples of the electronic devices described herein may include, but are in no way limited to, printed circuit boards (PCBs), computer chips, chipsets, physical memory devices, communications antenna, surface-mount components, through-mount components, power supplies, electrical circuits, traces, etc., and/or combinations thereof.

This disclosure is to address the issues in the prior art identified above by using a mold placed on the electronics module during the stencil/screen printing process; the mold can be used to contain outflowing of the encapsulant materials and to make certain an encapsulation of sufficient height, or thickness, is printed to fully cover the electronics. The mold can be removed after the printing process, or the mold can also be a part of products after stencil printing/curing. For embodiments in which the mold is part of the final product, only flexible materials, such as TPU, silicone, rubber, and the like, can be used for flexible electronics applications.

Several materials can be used for the mold. Rigid materials, such as steel, aluminum, carbon composite, and PTFE-based materials are appropriate where the mold will be removed after encapsulant printing. Flexible or soft materials, such as urethane, silicone, rubber, and the like are appropriate where the mold can either be removed after printing, or remain with the final product.

In some embodiments, the method may begin by selecting a suitable material for a mold. The mold material may correspond to any material capable of supporting and providing a mold for the encapsulation materials. Examples of mold materials may include, but are in no way limited to, silicone, thermoplastic polyurethane (TPU), rubber, room-temperature vulcanizing (RTV) silicone, epoxy, acrylic, polymer materials, resins, thermosetting plastic, adhesive potting compounds, potting materials, metals, etc., and/or combinations thereof. These materials may also be used for the encapsulating material. The selection of the mold material may depend on the particular industry and/or application for the electronic device. For instance, the mold material may be selected for particular insulative properties (e.g., thermal, electric, etc.), moisture-blocking capabilities, mechanical shock absorption, and/or the like, if the mold stays with the final products after printing. In other embodiments, the mold material may be a rigid material such as a metal.

Once the mold material is selected, the mold may be formed. The mold base may comprise at least one layer of material shaped to support at least a portion of the electronic device. In one embodiment, the mold may be formed to include an opening, or a cavity, into which at least a portion of the electronic device may be placed and/or retained. In some embodiments, the mold may comprise a top layer, a middle layer, and a bottom layer of mold material, which may be arranged to surround the electronic device. Forming the mold may include casting, or molding, the mold material into a predetermined shape (e.g., sheet, housing, box, hollow structure, etc.). The mold may be formed into the predetermined shape using any molding, casting, machining, or forming technique. In some embodiments, at least a portion of the mold may be made before integrating with the electronic device.

In one embodiment, the mold may be formed as a three-dimensional solid comprising an electronic device receiving cavity. The cavity may be formed via a molding technique utilizing a mold core, casting the mold base in a machined body including a corresponding cavity protrusion, or other technique while the mold is being formed. In some embodiments, the cavity may be formed after the mold is formed. For example, the cavity may be machined, etched, and/or cut into the three-dimensional solid (e.g., via laser cutting, die cutting, etc.). In any case, the cavity may be formed such that an electronic module, or electronic device, or a portion thereof, may be placed therein.

Encapsulating the electronic device may include positioning at least a portion of the device onto, or inside, the mold. Once arranged on, or inside, the mold, the method may continue by disposing encapsulation material around the electronic device and onto, or into, the mold. In one embodiment, the encapsulation material may be poured (e.g., in a liquid form) onto the electronic device and/or into the cavity of the mold shell. In some embodiments, the encapsulation material may be applied by stencil printing or screen printing. In some embodiments, this liquid encapsulant may be a combination of two or more materials. For example, two liquid or pourable materials may be mixed together to form the liquid encapsulant.

Once the liquid encapsulant is formed, it may be deposited in the mold holding or otherwise supporting the electronic device. Depositing the liquid encapsulant may include injecting, pouring, or otherwise spreading the liquid encapsulant around the electronic device in the mold cavity. In some embodiments, the liquid encapsulant may be cast into the pre-made mold around the electronic device. In some embodiments, the encapsulation material may be applied by stencil printing or screen printing.

The liquid encapsulant dispensed, or printed, over the electronic device may bond to one or more surfaces of the electronic device, the mold, and/or both the mold and the electronic device. In some embodiments, the liquid encapsulant may be the same material as the mold (e.g., the mold and the liquid encapsulant may both be silicone, epoxy, etc.). In one embodiment, the liquid encapsulant may be a different material than the mold (e.g., the mold may be TPU and the liquid encapsulant may be an epoxy, etc.). The liquid encapsulant material may vary, and is not particularly limited. For example, the liquid encapsulant may be, but is in no way limited to, silicone, TPU, rubber, RTV silicone, polymer materials, resins, thermosetting plastic, adhesive potting compounds, potting materials, acrylic, epoxy, etc., and/or combinations thereof. In some embodiments, the liquid encapsulant may be pre-mixed and/or degassed before being dispensed onto the mold shell and electronic device. This step may ensure the correct chemical properties of the liquid encapsulant prior to use. In some embodiments, the liquid encapsulant may be dispensed into the cavity of the mold prior to inserting the electronic device into the cavity of mold shell. This may be done to ensure the bottom of the electronic module is exposed to the liquid encapsulant and properly bonds to the mold.

In some embodiments, the electronic module may have connective wiring exiting through the liquid encapsulant, the mold, and/or both. For instance, in one embodiment, the electronic module may contain at least one ribbon cable, connector, pin, and/or other electrical contact that protrudes through the liquid encapsulant, or the mold, to allow the electronic device to be electrically interconnected to another component through the integral encapsulation package. The type of wiring or electrical connections are not limited to ribbon cables, pins, or other connectors, and other connections, such as pre-potted pins, bulkhead connectors, and/or the like, may be used to provide an electrical interconnection from an outside of the integral encapsulation package to the electronic device encapsulated therein.

After the liquid encapsulant is dispensed, or printed, the dispensed liquid encapsulant is cured. The liquid encapsulant may be heat cured, time cured, ultraviolet (UV) light cured, and/or combinations thereof. In one embodiment, heat curing may include an application of heat (e.g., via thermal conduction, thermal convection, and/or thermal radiation). In some embodiments, the integral encapsulation package may be baked to a predetermined temperature to cure and/or otherwise set the dispensed liquid encapsulant forming the integral encapsulation package. In one embodiment, the liquid encapsulant material may be light-curable and a UV light can be used to cure the dispensed liquid encapsulant.

In some embodiments, a top encapsulant layer may be placed on top of the mold and the liquid encapsulant to fully seal and/or form the integral encapsulation package, or encapsulated flexible electronic device. The top encapsulant layer, or cover, is not limited to any particular material, and may be made from any of the materials listed above. In some embodiments, the material of the top encapsulant layer may include one or more textiles or natural materials (e.g., leather, fabric, and/or the like). In one embodiment, the top encapsulant layer may comprise one or more layers and/or sub-layers. The top encapsulant layer may be bonded to the top of the apparatus and subsequently cured to form the integral encapsulation package. In some embodiments, the liquid encapsulant in the mold shell may be only partially cured prior to the placement of the top encapsulant layer, and subsequently cured together after the addition of the top encapsulant layer ensuring the liquid encapsulant bonds to the top encapsulant layer forming the integral encapsulation package.

Figure 1B:
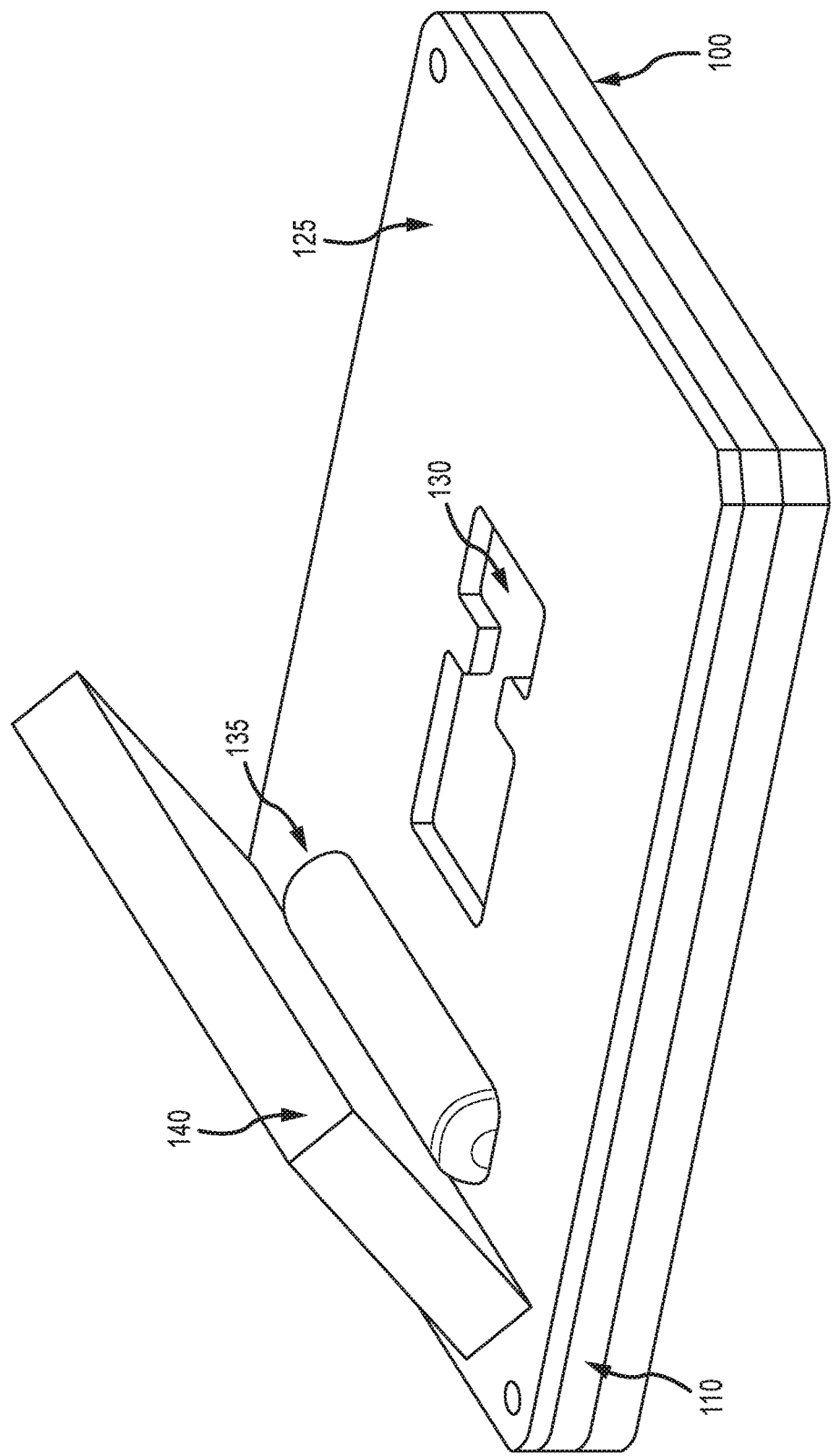
FIG. 1B shows a perspective view of an arrangement for encapsulating an electronic device in accordance with an embodiment of the present disclosure.

Referring now to FIGS. 1A-1B, perspective views of an arrangement for encapsulating an electronic device according with embodiments of the present disclosure are shown. A printer vacuum block 100 is provided to hold electronic device 105 in place during the encapsulation process. At least a portion of electronic device 105 is disposed within a cavity formed in a mold 110. Electronic device 105 has a first surface 115 with a plurality of electronic components 120 mounted thereon.

Stencil 125 is disposed on mold 110. Stencil 125 has a stencil aperture 130 defining an area for the encapsulant to be printed. In some embodiments, stencil aperture 130 is substantially the same shape as the cavity in mold 110. A portion of encapsulant material 135 is provided in liquid or past form on stencil 125. In this embodiment, during the encapsulation process, squeegee 140 applies force to encapsulant material 135 such that a desired portion of encapsulant material is deposited into stencil aperture 130 and then into the cavity in mold 110, with excess encapsulant material remaining on stencil 125 for removal.

As shown in FIGS. 1A-1B, mold 110 is of a sufficient thickness to enable encapsulant material 135 to completely cover electronic components 120, e.g. of greater thickness than the height of electronic components 120 measured upward from first surface 115. In one embodiment, mold is at least 10 microns thick.

Figure 2:
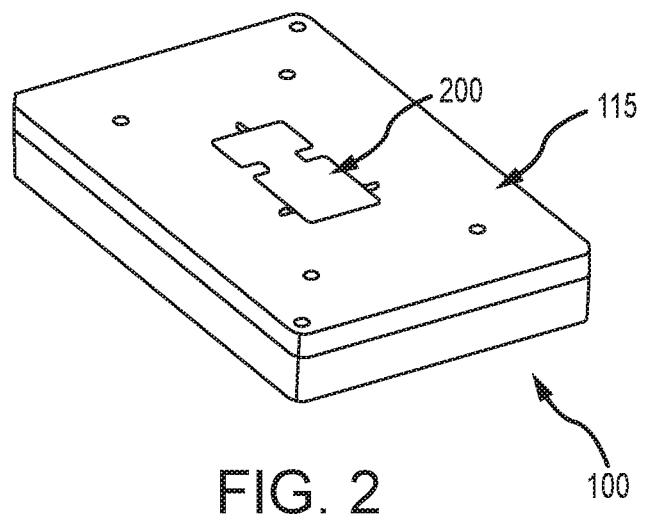
FIG. 2 shows a perspective view of an arrangement for encapsulating an electronic device in accordance with embodiments of the present disclosure.

Referring now to FIG. 2, a perspective view of an arrangement for encapsulating an electronic device according to embodiments of the present disclosure is shown. At this stage of the encapsulation process, the electronic device has been cured forming encapsulant 200. As can be seen, a top surface of encapsulant 200 is substantially coplanar with a top surface of mold 115.

Figure 3:
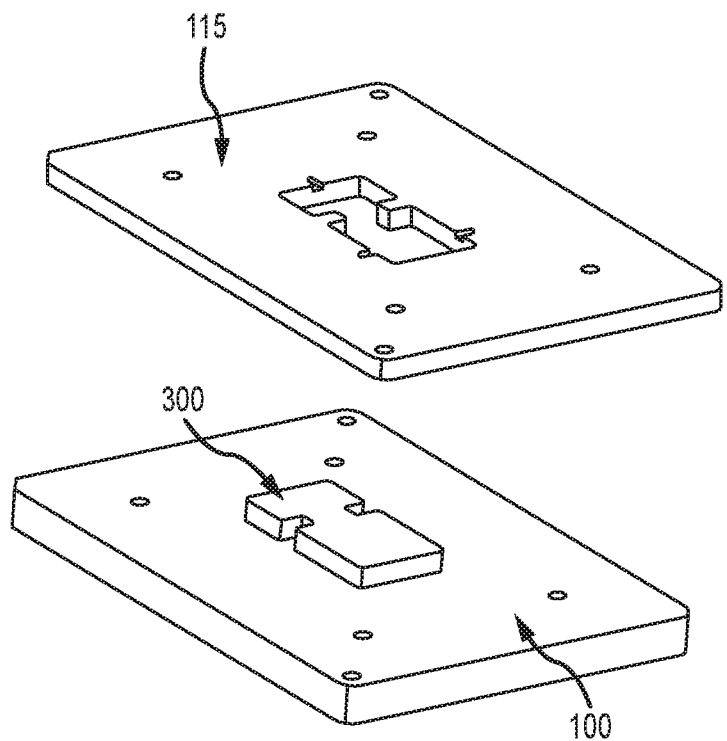
FIG. 3 shows a perspective view of an arrangement for encapsulating an electronic device in accordance with embodiments of the present disclosure.

Referring now to FIG. 3, mold 115 is removed leaving encapsulated electronic device 300 on printer vacuum block 100.

Figure 4:
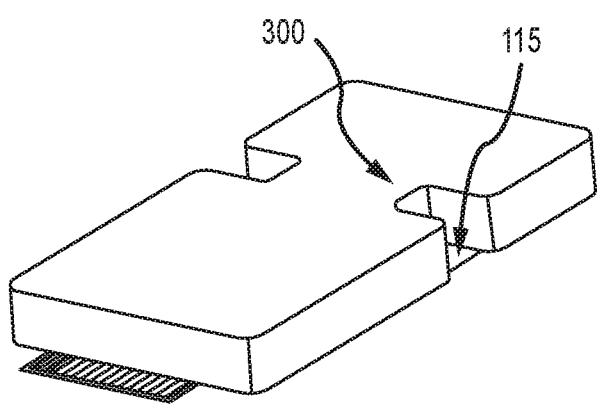
FIG. 4 shows a perspective view of an encapsulated electronic device in accordance with embodiments of the present disclosure.

Referring now to FIG. 4, a perspective view of encapsulated electronic device 300 is shown. As can be seen, encapsulant 200 has been formed only on a plane defined by first surface 115 in this embodiment.

Figure 5A:
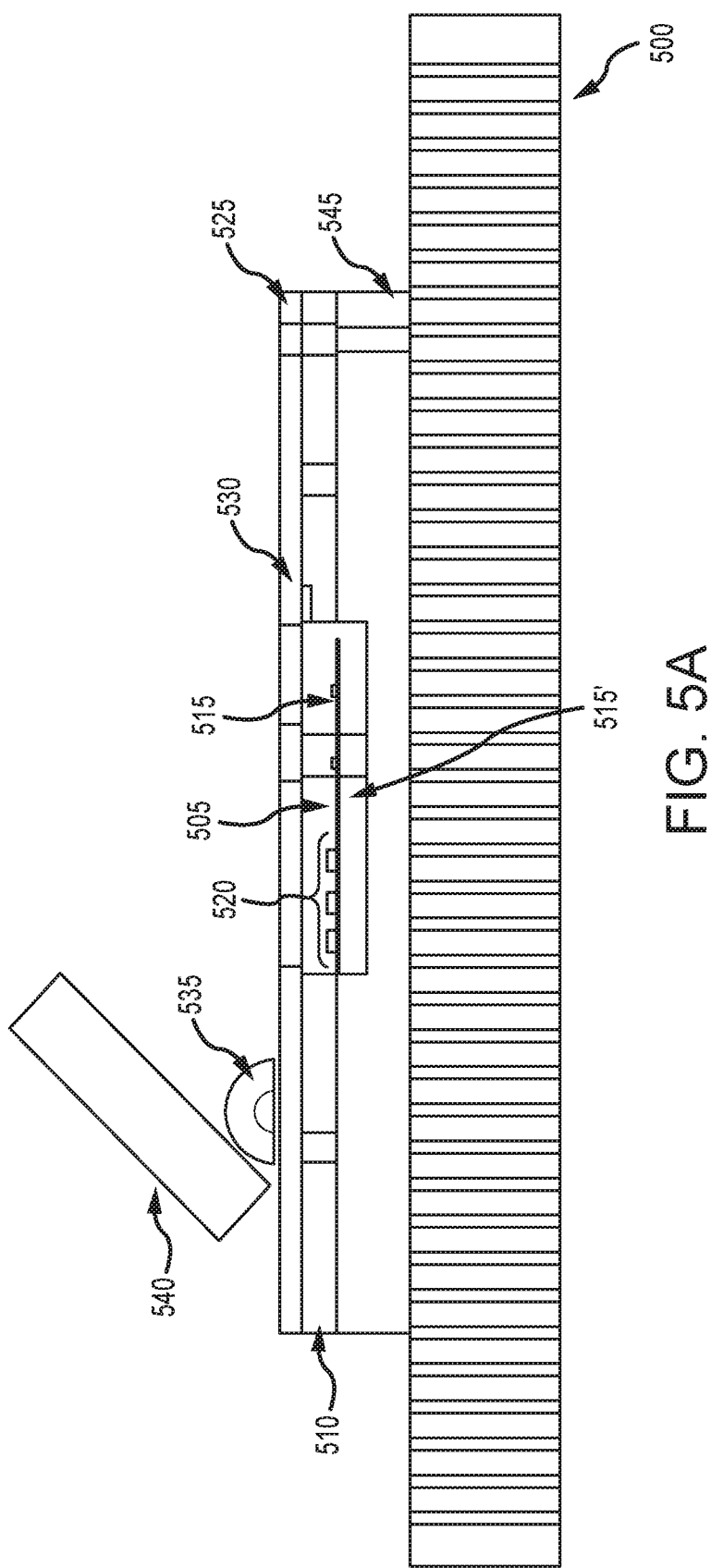
FIG. 5A shows a perspective view of an arrangement for encapsulating an electronic device in accordance with embodiments of the present disclosure.
Figure 5B:
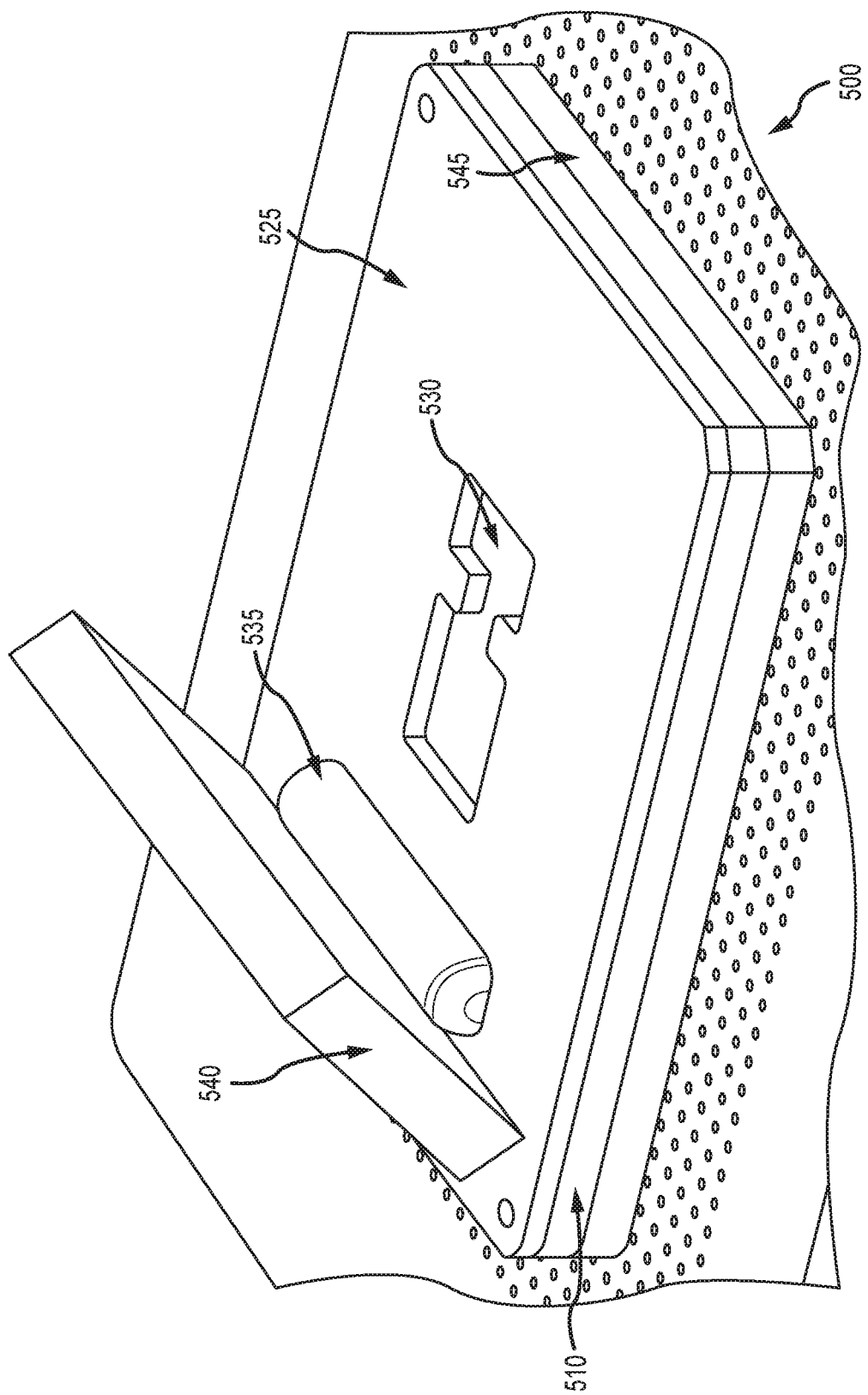
FIG. 5B shows a perspective view of an arrangement for encapsulating an electronic device in accordance with an embodiment of the present disclosure.

Referring now to FIGS. 5A-5B, perspective views of an arrangement for encapsulating an electronic device according with embodiments of the present disclosure are shown. A printer vacuum block 500 is provided to hold carrier 545 in place during the encapsulation process. Carrier 545 is a mechanical structure providing mechanical support during the manufacturing and encapsulation process. In some embodiments, carrier 545 may be formed of aluminum, steel, or a composite. Carrier 545 has a cavity formed therein to receive encapsulant material. At least a portion of electronic device 505 is disposed within a cavity formed in a mold 510. Electronic device 505 has a first surface 515 with a plurality of electronic components 520 mounted thereon. Electronic device 505 has a second surface 515'. During the encapsulation process, a gap exists between second surface 515' and a top surface of carrier 545.

Stencil 525 is disposed on mold 510. Stencil 525 has a stencil aperture 530 defining an area for the encapsulant to be printed. In some embodiments, stencil aperture 530 is substantially the same shape as the cavity in mold 510. In some embodiments, stencil aperture 530 is substantially the same shape as the cavity in mold 510 and the cavity in mold 545. A portion of encapsulant material 535 is provided in liquid or past form on stencil 525. In this embodiment, during the encapsulation process, squeegee 540 applies force to encapsulant material 535 such that a desired portion of encapsulant material is deposited into stencil aperture 530 and then into the cavity in mold 510, with excess encapsulant material remaining on stencil 525 for removal.

In this embodiment, encapsulant material is also disposed within the cavity in carrier 545 such that encapsulant material substantially fills the gap formed by the cavity in carrier 545 and second surface 515' of electronic device 505. This can be accomplished in numerous ways. In one embodiment, the cavity in carrier 545 is filled with encapsulant material prior to electronic device 505 being disposed within the cavity formed in mold 510. Then, curing can be applied before applying additional encapsulant to first surface 515. In another embodiment, electronic device 505 has one or more apertures extending from first surface 515 through second surface 515' such that when squeegee 540 applies force to encapsulant material 535, a portion of encapsulant material 535 passes through the one or more apertures in electronic device 505, thereby substantially filling the gap formed by second surface 515' and the cavity in carrier 545. In another embodiment, electronic device 505 has one or more gaps formed in the perimeter of the electronic device extending from first surface 515 through second surface 515' such that when squeegee 540 applies force to encapsulant material 535, a portion of encapsulant material 535 passes through the one or more gaps in electronic device 505, thereby substantially filling the gap formed by second surface 515' and the cavity in carrier 545.

As shown in FIGS. 5A-5B, mold 510 is of a sufficient thickness to enable encapsulant material 535 to completely cover electronic components 520, e.g. of greater thickness than the height of electronic components 520 measured upward from first surface 515. In one embodiment, mold is at least 10 microns thick.

Figure 6:
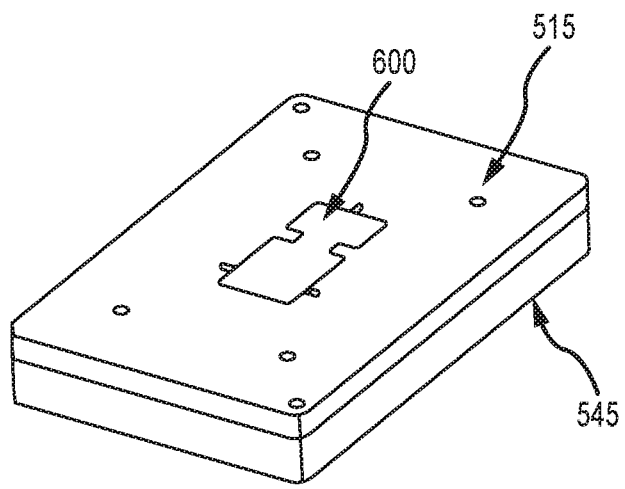
FIG. 6 shows a perspective view of an arrangement for encapsulating an electronic device in accordance with embodiments of the present disclosure.

Referring now to FIG. 6, a perspective view of an arrangement for encapsulating an electronic device according to embodiments of the present disclosure is shown. At this stage of the encapsulation process, the electronic device has been cured forming encapsulant 600. As can be seen, a top surface of encapsulant 600 is substantially coplanar with a top surface of mold 515.

Figure 7:
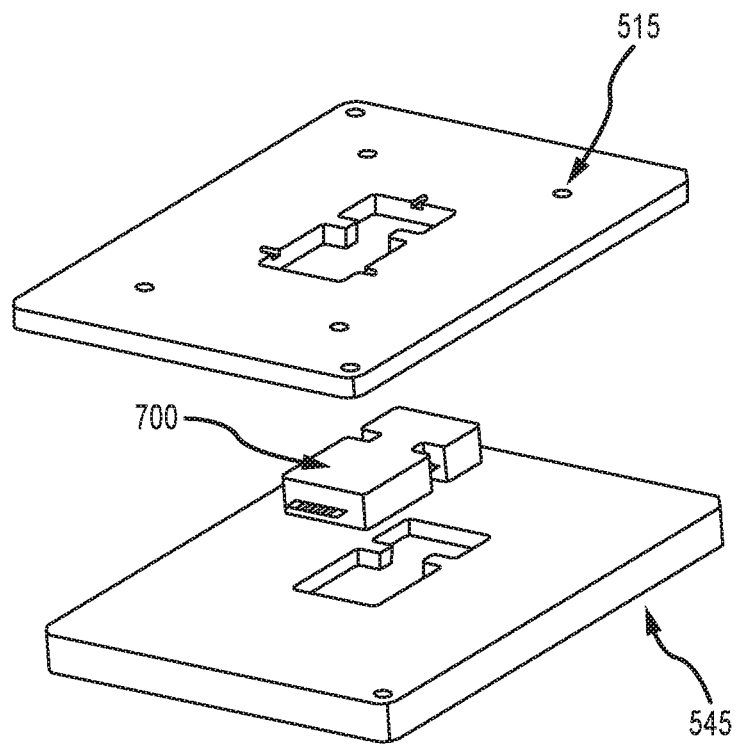
FIG. 7 shows a perspective view of an arrangement for encapsulating an electronic device in accordance with embodiments of the present disclosure.

Referring now to FIG. 7, mold 515 is removed leaving encapsulated electronic device 700, which is removed from carrier 545.

Figure 8:
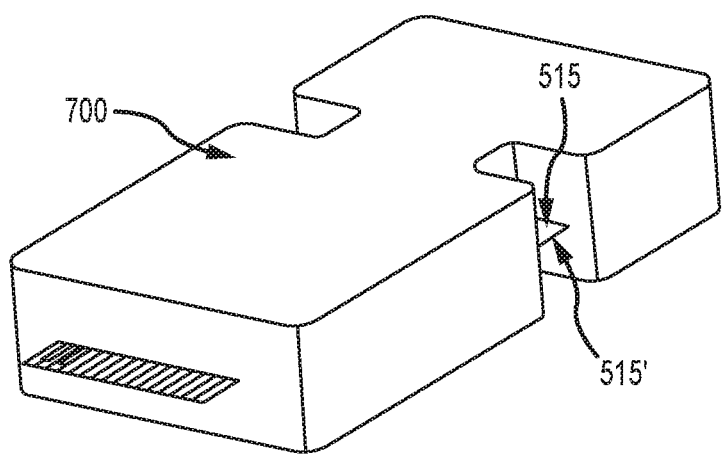
FIG. 8 shows a perspective view of an encapsulated electronic device in accordance with embodiments of the present disclosure.

Referring now to FIG. 8, a perspective view of encapsulated electronic device 700 is shown. As can be seen, encapsulant 600 has been on a first plane defined by first surface 515 and on a second plane defined by second surface 515'.

In some embodiments, the mold may become part of the final product (e.g., along with the added encapsulation material). In these embodiments, the mold in the present disclosure does not need to be separated from the final electronics device package.

Figure 9:
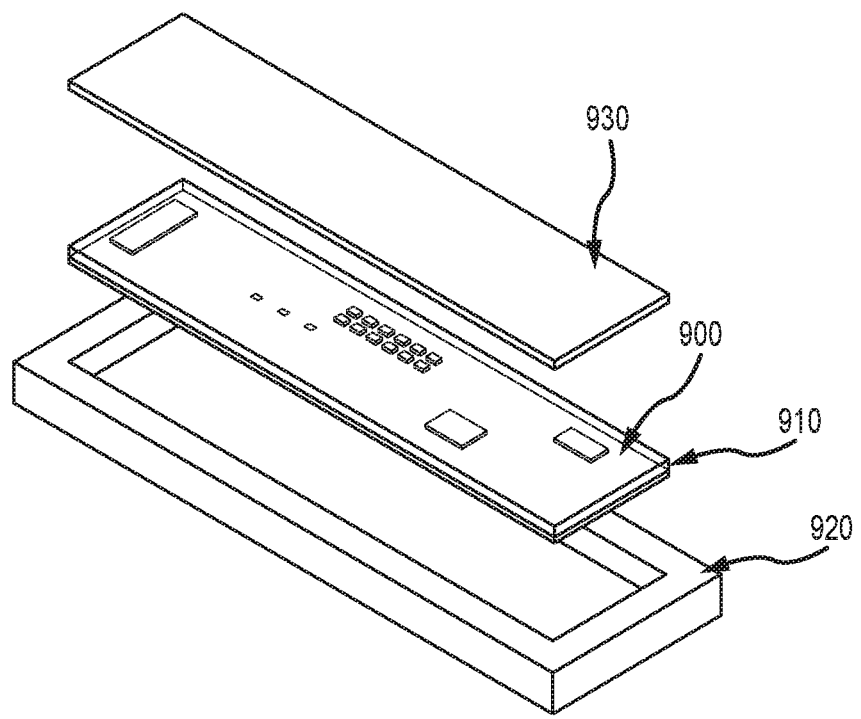
FIG. 9 shows an exploded view of an encapsulated electronic device in accordance with embodiments of the present disclosure.

Referring now to FIG. 9, an exploded view of an encapsulated electronic device formed according to the present disclosure is shown. Electronic device 900 is encapsulated by encapsulant 910, which has been formed according to the present disclosure using mold 920. Encapsulant top layer 930 is formed after encapsulant 910 is formed.

Figure 10:
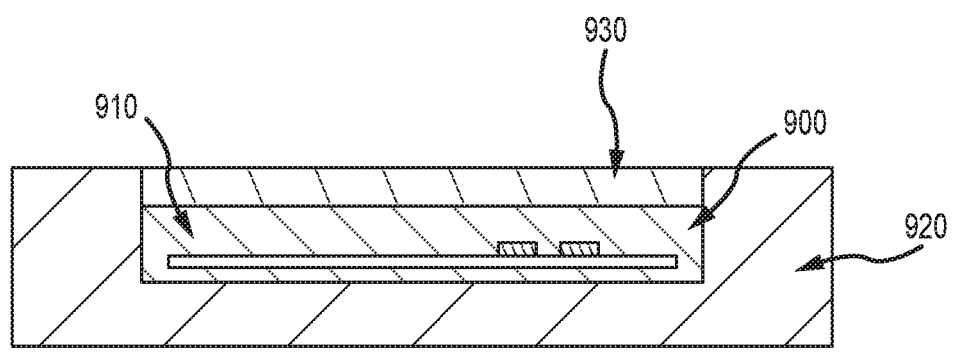
FIG. 10 shows a cross-sectional view of an encapsulated electronic device in accordance with embodiments of the present disclosure.

Referring now to FIG. 10, a cross-sectional view of an encapsulated electronic device formed according to the present disclosure is shown. Electronic device 900 is encapsulated by encapsulant 910, which has been formed according to the present disclosure using mold 920. Encapsulant top layer 930 is formed after encapsulant 910 is formed.

Figure 11:
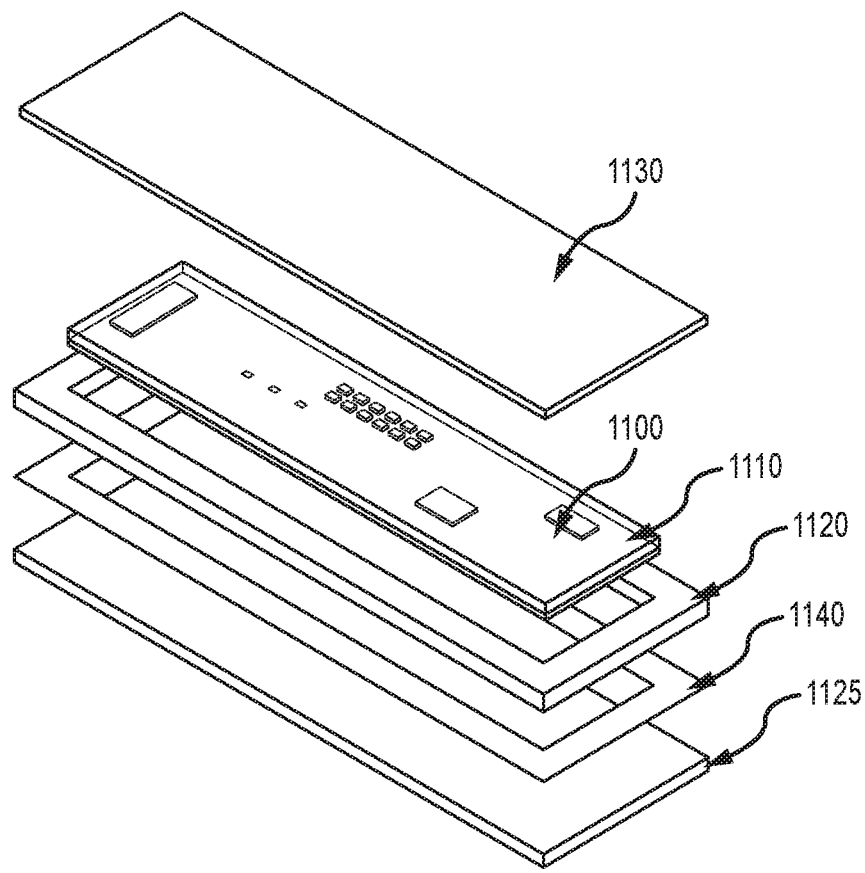
FIG. 11 shows an exploded view of an encapsulated electronic device in accordance with embodiments of the present disclosure.

Referring now to FIG. 11, an exploded view of an encapsulated electronic device formed according to the present disclosure is shown. Electronic device 1100 is encapsulated by encapsulant 1110, which has been formed according to the present disclosure using a mold comprising mold top later 1120 and mold bottom layer 1125. Encapsulant top layer 1130 is formed after encapsulant 1110 is formed. Adhesive 1140 bonds together mold top later 1120 and mold bottom layer 1125.

Figure 12:
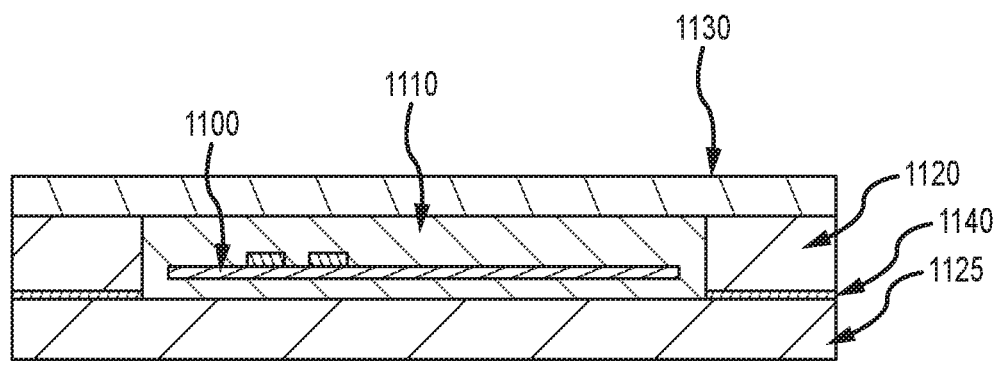
FIG. 12 shows a cross-sectional view of an encapsulated electronic device in accordance with embodiments of the present disclosure.

Referring now to FIG. 12, a cross-sectional view of an encapsulated electronic device formed according to the present disclosure is shown. Electronic device 1100 is encapsulated by encapsulant 1110, which has been formed according to the present disclosure using a mold comprising mold top later 1120 and mold bottom layer 1125. Encapsulant top layer 1130 is formed after encapsulant 1110 is formed. Adhesive 1140 bonds together mold top later 1120 and mold bottom layer 1125.

Figure 13:
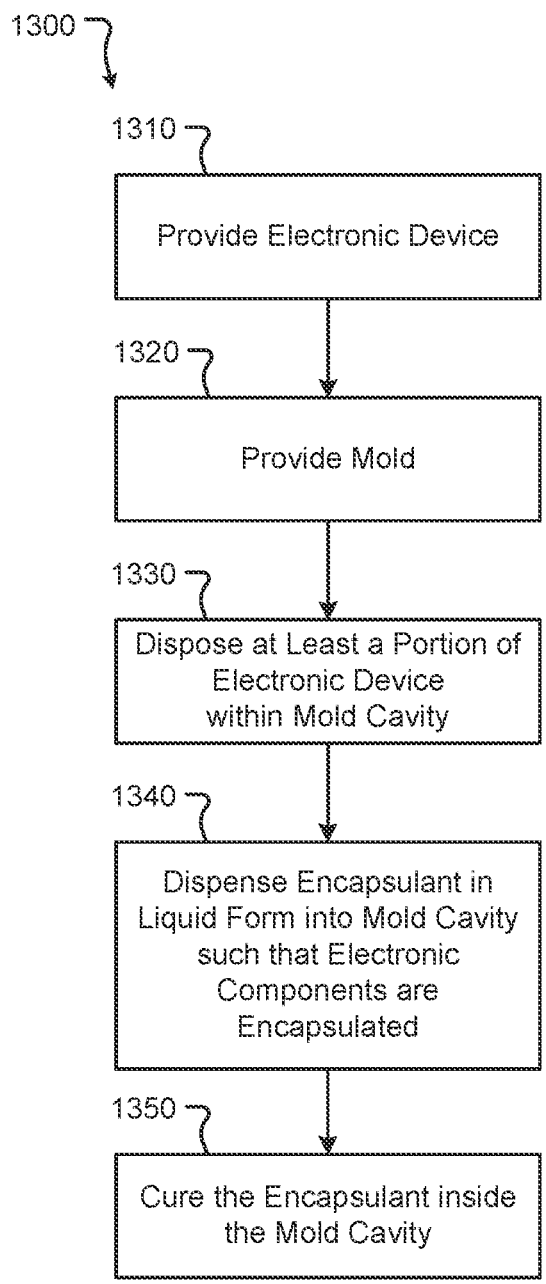
FIG. 13 shows a flow diagram of a method of encapsulating an electronic device in accordance with embodiments of the present disclosure.

Referring now to FIG. 13, a flow diagram of a method 1300 of encapsulating an electronic device in accordance with embodiments of the present disclosure is shown. In step 1310, an electronic device having electronic components mounted thereon is provided. In step 1320, a mold is provided. In step 1330, at least a portion of the electronic device is disposed within a cavity in the mold. in step 1340, encapsulant material in liquid form is dispensed into the mold cavity, for example by screen printing or stencil printing, such that all electronic components mounted on the electronic device are encapsulated. In step 1350, the encapsulant is cured inside the mold cavity.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description.

Any of the steps, functions, and operations discussed herein can be performed continuously and automatically.

The exemplary systems and methods of this disclosure have been described in relation to a method for electronic module molding and encapsulation. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include a method of encapsulating an electronic device, comprising: disposing at least a portion of the electronic device within a cavity of a mold; dispensing an encapsulant in a liquid form into the cavity around the at least a portion of the electronic device; and curing the encapsulant such that the encapsulant bonds to the electronic device forming an encapsulated electronic device comprising the cured encapsulant and the electronic device; wherein the electronic device comprises a first plurality of electronic components mounted on a first surface of the electronic device; and wherein the mold has a thickness sufficient to enable the encapsulant to completely encapsulate each of the first plurality of electronic components.

Aspects of the above embodiments include wherein the mold is formed of a rigid material; wherein said rigid material is a metal; further comprising removing the mold following curing; wherein the mold is formed of a flexible material; wherein said flexible material is selected from a group consisting of silicone, rubber, thermoplastics, synthetic polymers, or a combination thereof; and wherein said dispensing is screen printing or stencil printing.

Embodiments include an encapsulated electronic device package prepared by a process, comprising: disposing at least a portion of the electronic device within a cavity of a mold dispensing an encapsulant in a liquid form into the cavity around the at least a portion of the electronic device; and curing the encapsulant such that the encapsulant bonds to the electronic device forming an encapsulated electronic device comprising the cured encapsulant and the electronic device; wherein the electronic device comprises a first plurality of electronic components mounted on a first surface of the electronic device; and wherein the mold has a thickness sufficient to enable the encapsulant to completely encapsulate each of the first plurality of electronic components.

Aspects of the above embodiments include wherein the mold is formed of a rigid material; wherein said rigid material is a metal; further comprising removing the mold following curing; wherein the mold is formed of a flexible material; wherein said flexible material selected from a group consisting of silicone, rubber, thermoplastics, synthetic polymers, or a combination thereof; and wherein said dispensing is screen printing or stencil printing.

Embodiments include a method of encapsulating an electronic device having a first surface and a second surface, comprising: disposing at least a portion of the electronic device within a first cavity of a carrier and a second cavity of a mold; dispensing an encapsulant in a liquid form into the first cavity and into the second cavity around the at least a portion of the electronic device such that the encapsulant contacts said first surface and said second surface; and curing the encapsulant such that the encapsulant bonds to the electronic device forming an encapsulated electronic device comprising the cured encapsulant and the electronic device; wherein the electronic device comprises a first plurality of electronic components mounted on a first surface of the electronic device and a second plurality of electronic components mounted on a second surface; and wherein the mold has a thickness sufficient to enable the encapsulant to completely encapsulate each of the first plurality of electronic components and each of the second plurality of electronic components.

Aspects of the above embodiments include wherein the mold is formed of a rigid material; wherein said rigid material is a metal; wherein said dispensing is screen printing or stencil printing; and wherein the mold is formed of a flexible material; wherein said flexible material selected from the group consisting of silicone, rubber, thermoplastics, synthetic polymers, or a combination thereof.

Any one or more of the aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," "compute," and variations thereof, as used herein, are used interchangeably and include any type of methodology, process, mathematical operation or technique.

What is claimed is:

1. A method of encapsulating an electronic device having a first electronic device surface and a second electronic device surface, comprising:
   providing a carrier on a substantially flat surface, said carrier having an upper carrier surface and a lower carrier surface, said upper carrier surface having a carrier cavity formed therein;
   disposing a mold on said upper carrier surface, said mold having an upper mold surface and a lower mold surface, said upper mold surface having a mold cavity formed therein;
   disposing at least a portion of the electronic device into the carrier cavity and the mold cavity from above said upper mold surface;
   dispensing an encapsulant in a liquid form into the carrier cavity and into the mold cavity from above said upper mold surface such that said encapsulant surrounds the at least a portion of the electronic device such that the encapsulant contacts said first surface and said second surface, wherein said dispensing is screen printing or stencil printing; and
   curing the encapsulant such that the encapsulant bonds to the electronic device forming an encapsulated electronic device comprising the cured encapsulant and the electronic device;
   wherein the electronic device comprises a first plurality of electronic components mounted on the first electronic device surface and a second plurality of electronic components mounted on the second electronic device surface; and
   wherein the mold has a thickness sufficient to enable the encapsulant to completely encapsulate each of the first plurality of electronic components and each of the second plurality of electronic components.

2. The method of claim 1, wherein the mold is formed of a rigid material.

3. The method of claim 2, wherein said rigid material is a metal.

4. The method of claim 1, wherein the mold is formed of a flexible material.

5. The method of claim 4, wherein said flexible material selected from the group consisting of silicone, rubber, thermoplastics, synthetic polymers, or a combination thereof.

* * * * *